(12) United States Patent
Kitajima

(10) Patent No.: US 9,319,092 B2
(45) Date of Patent: Apr. 19, 2016

(54) HIGH-FREQUENCY MODULE

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 304 days.

(21) Appl. No.: 13/966,463

(22) Filed: Aug. 14, 2013

(65) Prior Publication Data

US 2013/0329611 A1 Dec. 12, 2013

Related U.S. Application Data

(63) Continuation of application No. PCT/JP2012/054715, filed on Feb. 27, 2012.

(30) Foreign Application Priority Data

Mar. 2, 2011 (JP) ................................. 2011-045142

(51) Int. Cl.
*H04B 7/005* (2006.01)
*H04B 1/44* (2006.01)
*H04B 1/00* (2006.01)
*H04B 1/52* (2015.01)
*H05K 1/02* (2006.01)

(52) U.S. Cl.
CPC ................. *H04B 1/44* (2013.01); *H04B 1/006* (2013.01); *H04B 1/52* (2013.01); *H05K 1/0243* (2013.01); *H05K 2201/09227* (2013.01)

(58) Field of Classification Search
None
See application file for complete search history.

(56) References Cited

U.S. PATENT DOCUMENTS

| | | | |
|---|---|---|---|
| 7,236,758 B1* | 6/2007 | Cheah | H04B 1/40 348/723 |
| 2002/0071452 A1* | 6/2002 | Abraham | H04B 3/542 370/480 |
| 2004/0032706 A1 | 2/2004 | Kemmochi et al. | |
| 2004/0075491 A1* | 4/2004 | Kushitani | H04B 1/52 330/51 |
| 2005/0176380 A1 | 8/2005 | Okabe et al. | |
| 2007/0040633 A1* | 2/2007 | Yoshimoto | H03H 9/14597 333/193 |
| 2011/0221542 A1 | 9/2011 | Kihara | |
| 2011/0260806 A1 | 10/2011 | Takeuchi | |
| 2012/0075002 A1 | 3/2012 | Uejima et al. | |
| 2014/0157860 A1 | 6/2014 | Tuunanen | |

FOREIGN PATENT DOCUMENTS

| | | |
|---|---|---|
| CN | 101401317 A | 4/2009 |
| JP | 2005-136887 A | 5/2005 |

(Continued)

OTHER PUBLICATIONS

Official Communication issued in International Patent Application No. PCT/JP2012/054715, mailed on Mar. 27, 2012.

*Primary Examiner* — Kibrom T Hailu
(74) *Attorney, Agent, or Firm* — Keating & Bennett, LLP

(57) ABSTRACT

In a high frequency module, mounting lands for reception signal output side ports of SAW duplexers, respectively, on a top surface of a multilayer body are arranged so as to be superposed on reception side external connection lands on a bottom surface of the multilayer body along the layer direction and the mounting lands are directly connected to the reception side external connection lands via holes. Transmission side external connection lands are located on the bottom surface of the multilayer body. The transmission side external connection lands are connected to mounting lands for transmission signal input side ports on the top surface of the multilayer body via certain inner layer electrodes that do not come close to the via holes of the reception system and the via holes.

20 Claims, 4 Drawing Sheets

(56) References Cited

FOREIGN PATENT DOCUMENTS

| JP | 2005-223582 A | 8/2005 |
|---|---|---|
| JP | 2005-260835 A | 9/2005 |
| JP | 2008-010995 A | 1/2008 |
| JP | 3147878 U | 1/2009 |
| JP | 2010-220231 A | 9/2010 |
| JP | 4539788 B2 | 9/2010 |
| WO | 2010/053131 A1 | 5/2010 |
| WO | 2010/143472 A1 | 12/2010 |

* cited by examiner

HIGH-FREQUENCY MODULE

BACKGROUND OF THE INVENTION

1. Field of the Invention

The present invention relates to a high-frequency module that transmits and receives multiple communication signals with a common antenna.

2. Description of the Related Art

Various high-frequency modules have heretofore been proposed, which transmit and receive multiple communication signals using different frequency bands with common antennas. For example, a high-frequency module described in Japanese Unexamined Patent Application Publication No. 2008-10995 includes multiple duplexers each including a pair of surface acoustic wave (SAW) filters and a switch integrated circuit (IC). The SAW duplexers and the switch IC are mounted on a front surface of a multilayer body composing other circuits of the high-frequency module. External connection terminals of the high-frequency module are aligned and formed on a bottom surface of the multilayer body.

In such a high-frequency module, it is necessary to achieve high isolation between a circuit in which transmission signals are transmitted and a circuit in which reception signals are transmitted. Accordingly, the high-frequency module described in Japanese Unexamined Patent Application Publication No. 2008-10995 adopts a structure in which the external connection terminals at the reception circuit side and the external connection terminals at the transmission circuit side are aligned and formed along opposing side surfaces in a plan view of the multilayer body.

However, since the isolation is not consciously considered in the mounting pattern on the front surface of the multilayer body and the wiring pattern, for example, in the multilayer body in the structure of the high-frequency module described in Japanese Unexamined Patent Application Publication No. 2008-10995 although the isolation between the transmission side circuit and the reception side circuit is capable of being ensured for the external connection terminals of the multilayer body, the isolation may possibly be reduced. In particular, when the SAW duplexers that each multiplex and demultiplex the transmission signal and the reception signal are used, the isolation further tends to decrease.

SUMMARY OF THE INVENTION

In order to resolve the above problems, preferred embodiments of the present invention provide a high-frequency module that achieves sufficient isolation even with SAW duplexers that multiplex and demultiplex the transmission signal and the reception signal.

According to a preferred embodiment of the present invention, a high-frequency module includes a switch IC that includes a common terminal and multiple individual terminals; and a SAW duplexer that is connected to the individual terminals and that multiplexes and demultiplexes a transmission signal and a reception signal of a communication signal. The high-frequency module includes a multilayer body that includes mounting lands with which the switch IC and the SAW duplexer are mounted on a certain surface other than a bottom surface and also includes external connection lands on the bottom surface and that has a certain three-dimensional shape. A transmission side external connection land with which the transmission signal is input and an external connection land connected to an antenna, and a reception side external connection land with which the reception signal is output are provided along opposing sides, in a plan view of the multilayer body, so that the transmission side external connection land and the external connection land connected to the antenna are spaced apart from the reception side external connection land. A reception side mounting land where a reception signal side port of the SAW duplexer is mounted is connected to the reception side external connection land substantially only via via holes.

With the above configuration, the transmission side external connection land for connection to an external transmission circuit and the reception side external connection land for connection to an external reception circuit are arranged on the bottom surface of the multilayer body so that the transmission side external connection land is spaced apart from the reception side external connection land. In addition, the reception side mounting land of the SAW duplexer mounted on a mounting surface of the multilayer body is connected to the reception side external connection land on the bottom surface of the multilayer body substantially only via the via holes. This realizes a wiring structure in the multilayer body, in which the reception side external connection land is linearly or substantially linearly connected to the reception side mounting land of the SAW duplexer along the layer direction. Accordingly, a structure in which the transmission system circuit and the reception system circuit are superposed on one another, as viewed from the layer direction, and a structure in which the transmission system circuit is close to the reception system circuit is prevented from occurring in the multilayer body to ensure sufficient isolation.

In the high-frequency module according to a preferred embodiment of the present invention, the reception side external connection land and the external connection land connected to the antenna are provided along the opposing sides, in a plan view of the multilayer body, so that the reception side external connection land is spaced apart from the external connection land connected to the antenna.

With the above configuration, since the reception side external connection land is spaced apart from the external connection land connected to the antenna, it is also possible to increase the isolation between the reception side external connection land and the external connection land connected to the antenna.

In the high-frequency module according to a preferred embodiment of the present invention, the switch IC is arranged along one side of the multilayer body along which the transmission side external connection land is arranged and the SAW duplexer is arranged along the other side of the multilayer body along which the reception side external connection land is arranged.

With the above configuration, since the switch IC is spaced apart from the SAW duplexer, it is possible to increase the isolation between these mounting components.

In the high-frequency module according to a preferred embodiment of the present invention, the reception side mounting land is provided at a position where the reception side mounting land is superposed on the reception side external connection land, in a plan view of the multilayer body.

The above configuration indicates a specific positional relationship between the reception side mounting land and the reception side external connection land.

In the high-frequency module according to a preferred embodiment of the present invention, ground electrodes are provided between the reception side external connection land and the transmission side external connection land and between the reception side mounting land and a transmission side mounting land where a transmission signal side port of the SAW duplexer is mounted, in a plan view of the multilayer body, at least one of on a mounting surface of the multilayer body and in the multilayer body. The ground electrodes are connected to a ground mounting land where a ground port of the mounted SAW duplexer is mounted via via holes.

The above configuration indicates the ground structure of the high-frequency module of the present application. Since the ground electrodes and the via holes that are connected to the ground electrodes and that extend in the layer direction exist between the reception system circuit including the reception side mounting land, the reception side external connection land, the via holes via which the reception side mounting land is connected to the reception side external connection land, and so on and the transmission system circuit including the transmission side mounting land and the transmission side external connection land in the above manner, it is possible to ensure the higher isolation between the transmission system circuit and the reception system circuit in the multilayer body.

In the high-frequency module according to a preferred embodiment of the present invention, an external ground connection electrode is located between the reception side external connection land and the transmission side external connection land on the bottom surface of the multilayer body, in a plan view of the multilayer body. The external ground connection electrode is arranged so as to be superposed on the ground mounting land, in a plan view of the multilayer body.

In the above configuration, the electrodes connected to the ground are provided between the transmission system circuit and the reception system circuit over the entire range of the layer direction from the mounting surface to the bottom surface of the multilayer body. Accordingly, it is possible to ensure the much higher isolation between the transmission system circuit and the reception system circuit.

In the high-frequency module according to a preferred embodiment of the present invention, the switch IC includes multiple individual terminals and different SAW duplexers are connected to the multiple individual terminals. An alignment axis of the reception side mounting land and an alignment axis of the transmission side mounting land, along which each SAW duplexer is mounted, are provided in parallel or substantially in parallel to each other at certain interval.

In the above configuration, the multiple SAW duplexers mounted on the mounting surface of the multilayer body are aligned and arranged so that the terminals are arranged so as to have the same positional relationship. Accordingly, it is possible to keep a certain distance between the transmission side mounting lands and the reception side mounting lands to increase the isolation between the transmission system circuit and the reception system circuit.

In the high-frequency module according to a preferred embodiment of the present invention, an antenna side port of each of the multiple SAW duplexers is arranged along a side opposite to the side where the reception signal side port and the transmission signal side port of the SAW duplexer are provided. The multiple SAW duplexers are mounted so that the reception signal side port and the transmission signal side port are sandwiched between the antenna side ports of the multiple SAW duplexers along the alignment axes of the reception side mounting land and the transmission side mounting land.

The above configuration indicates a more specific configuration when the multiple SAW duplexers are used. The arrangement of the multiple SAW duplexers in the above manner allows the high isolation to be ensured between the transmission system circuit and the antenna side circuit, and the reception system circuit in each SAW duplexer.

In the high-frequency module according to a preferred embodiment of the present invention, the transmission side external connection land and the external connection land connected to the antenna are aligned and arranged along one side of the multilayer body. The external connection land for application of a signal to drive the switch IC is provided between the transmission side external connection land and the external connection land connected to the antenna.

In the above configuration, the transmission side external connection land is spaced from the external connection land connected to the antenna by a certain distance on the bottom surface of the multilayer body and the lands that prevent electromagnetic field coupling are provided between the transmission side external connection land and the external connection land connected to the antenna. Accordingly, it is possible to ensure the isolation between the transmission system circuit and the antenna side circuit.

In the high-frequency module according to a preferred embodiment of the present invention, the multilayer body includes multiple dielectric layers that are stacked. A first inner layer ground electrode for the switch IC and a second inner layer ground electrode for the SAW duplexer are provided in the multilayer body. The first inner layer ground electrode and the second inner layer ground electrode are provided on different dielectric layers in the multilayer body.

With the above configuration, it is possible to prevent electromagnetic field coupling between the inner layer ground electrode for the switch IC and the inner layer ground electrode for the SAW duplexer.

According to various preferred embodiments of the present invention, it is possible to achieve the sufficient isolation between the transmission side circuit and the reception side circuit of the SAW duplexer even in the high-frequency module composed of the multilayer body in which the SAW duplexer that multiplexes and demultiplexes the transmission signal and the reception signal are mounted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
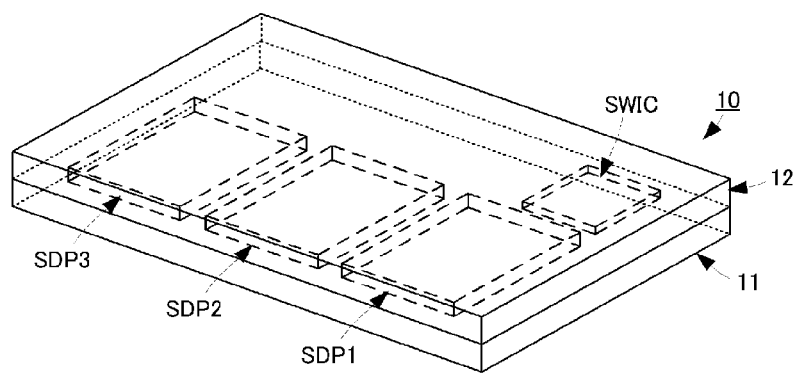
FIG. 2 is an external perspective view illustrating the main configuration of the high-frequency module 10 according to a preferred embodiment of the present invention.

A high-frequency module according to preferred embodiments of the present invention will herein be described with reference to the attached drawings. The high-frequency module is exemplified by a high-frequency switch module that transmits and receives first, second, and third communication signals using different frequency bands in the present preferred embodiment. FIG. 2 is an external perspective view illustrating the main configuration of a high-frequency module 10 of the present preferred embodiment. The high-frequency module 10 includes a switch IC element SWIC and SAW duplexers SDP1, SDP2, and SDP3.

The high-frequency module 10 includes a multilayer body 11 in which dielectric layers of a certain number are stacked, circuit elements disposed in the multilayer body 11, and circuit elements mounted on a top surface of the multilayer body. The switch IC element SWIC and the SAW duplexers SDP1, SDP2, and SDP3 are realized by the circuit elements that are mounted. The components other than the switch IC element SWIC and the SAW duplexers SDP1, SDP2, and SDP3, which define the high-frequency module 10, are realized by electrode patterns (including via holes) that are located on a top surface (mounting surface) of the multilayer body 11 and a bottom surface thereof and that are located in the high-frequency module 10. An insulation protection material 12 is arranged over the mounting surface of the multilayer body 11.

Figure 1:
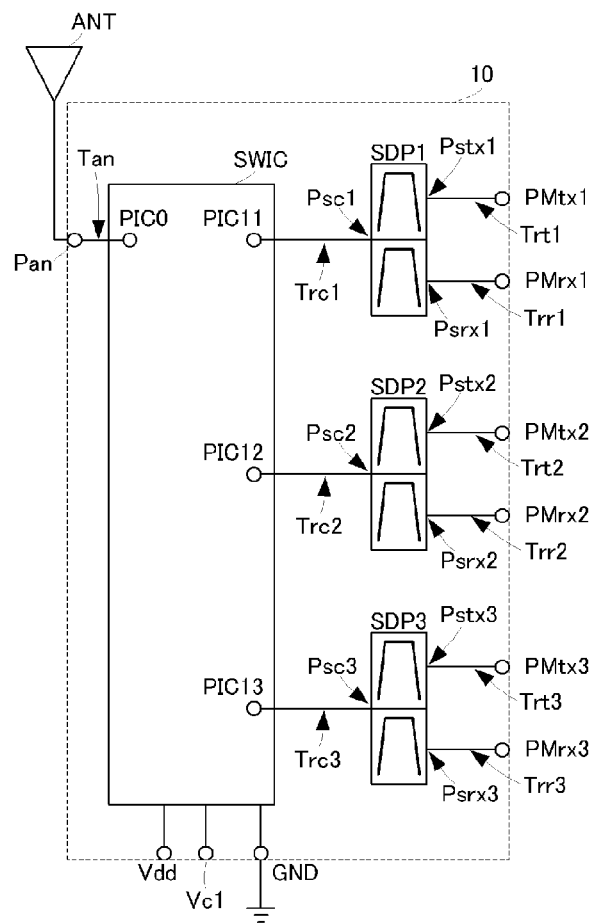
FIG. 1 is a circuit diagram of a high-frequency switch module 10 according to a preferred embodiment of the present invention.

A specific circuit configuration of the high-frequency module 10 will now be described. FIG. 1 is a circuit diagram of the high-frequency switch module 10 according to the present preferred embodiment of the present invention.

The switch IC element SWIC includes a single common terminal PIC0 and three individual terminals PIC11, PIC12, and PIC13 and is connected to ground GND. A drive voltage Vdd and a control voltage Vol are applied to the switch IC element SWIC. The control voltage Vol is controlled to connect the single common terminal PIC0 to any of the three individual terminals PIC11, PIC12, and PIC13.

The common terminal PIC0 of the switch IC element SWIC is connected to an antenna-side external connection land Pan of the high-frequency module 10 via an antenna-side electrode pattern Tan. The antenna-side external connection land Pan is connected to an external antenna ANT.

The first individual terminal PIC11 of the switch IC element SWIC is connected to an antenna-side mounting electrode Psc1 of the first SAW duplexer SDP1 via a first electrode pattern Trc1.

The first SAW duplexer SDP1 includes an antenna-side port Psc1, a transmission signal input side port Pstx1, and a reception signal output side port Psrx1. The first SAW duplexer SDP1 also includes a ground connection port PGND.

The first SAW duplexer SDP1 preferably includes a first SAW filter provided between the antenna-side port Psc1 and the transmission signal input side port Pstx1 and a second SAW filter provided between the antenna-side port Psc1 and the reception signal output side port Psrx1. The first SAW filter uses a transmission signal frequency band of the first communication signal as a pass band and uses the remaining frequency band as a cut-off band. The second SAW filter uses a reception signal frequency band of the first communication signal as the pass band and uses the remaining frequency band as the cut-off band.

The transmission signal input side port Pstx1 of the first SAW duplexer SDP1 is connected to a first transmission side external connection land PMtx1 of the high-frequency module 10 via a first transmission side electrode pattern Trt1.

The reception signal output side port Psrx1 of the first SAW duplexer SDP1 is connected to a first reception side external connection land PMrx1 of the high-frequency module 10 via a first reception side electrode pattern Trr1.

The second SAW duplexer SDP2 includes an antenna-side port Psc2, a transmission signal input side port Pstx2, and a reception signal side output port Psrx2. The second SAW duplexer SDP2 also includes a ground connection port PGND.

The second SAW duplexer SDP2 preferably includes a third SAW filter provided between the antenna-side port Psc2 and the transmission signal input side port Pstx2 and a fourth SAW filter provided between the antenna-side port Psc2 and the reception signal output side port Psrx2. The third SAW filter uses the transmission signal frequency band of the second communication signal as the pass band and uses the remaining frequency band as the cut-off band. The fourth SAW filter uses the reception signal frequency band of the second communication signal as the pass band and uses the remaining frequency band as the cut-off band.

The transmission signal input side port Pstx2 of the second SAW duplexer SDP2 is connected to a second transmission side external connection land PMtx2 of the high-frequency module 10 via a second transmission side electrode pattern Trt2.

The reception signal output side port Psrx2 of the second SAW duplexer SDP2 is connected to a second reception side external connection land PMrx2 of the high-frequency module 10 via a second reception side electrode pattern Trr2.

The third SAW duplexer SDP3 includes an antenna-side port Psc3, a transmission signal input side port Pstx3, and a reception signal output side port Psrx3. The third SAW duplexer SDP3 also includes a ground connection port PGND.

The third SAW duplexer SDP3 includes a fifth SAW filter provided between the antenna-side port Psc3 and the transmission signal input side port Pstx3 and a sixth SAW filter provided between the antenna-side port Psc3 and the reception signal output side port Psrx3. The fifth SAW filter uses the transmission signal frequency band of the third communication signal as the pass band and uses the remaining frequency band as the cut-off band. The sixth SAW filter uses the reception signal frequency band of the third communication signal as the pass band and uses the remaining frequency band as the cut-off band.

The transmission signal input side port Pstx3 of the third SAW duplexer SDP3 is connected to a third transmission side external connection land PMtx3 of the high-frequency module 10 via a third transmission side electrode pattern Trt3.

The reception signal output side port Psrx3 of the third SAW duplexer SDP3 is connected to a third reception side external connection land PMrx3 of the high-frequency module 10 via a third reception side electrode pattern Trr3.

Figure 3:
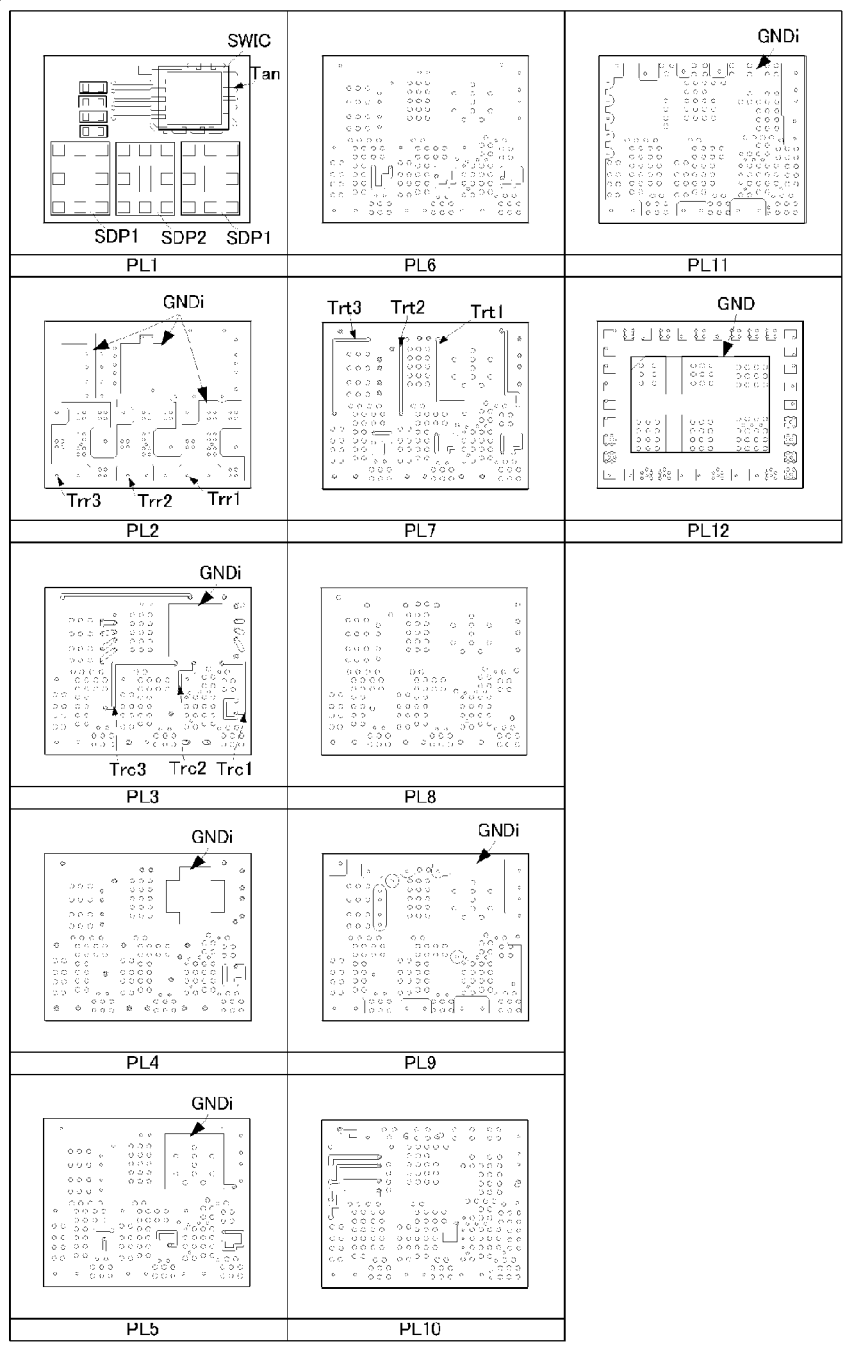
FIG. 3 is a layer diagram of the high-frequency module 10 according to a preferred embodiment of the present invention.
Figure 4A:
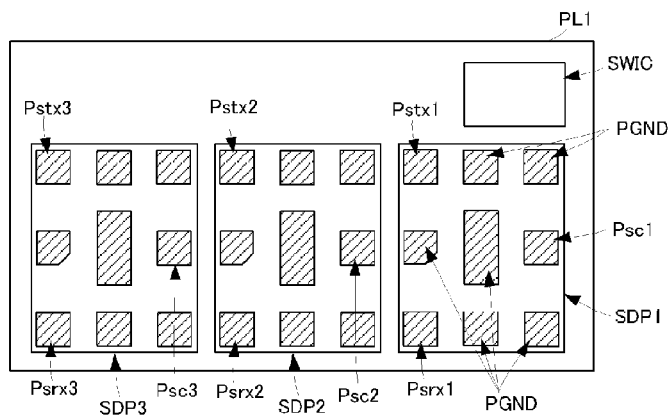
FIGS. 4A, 4B and 4C are diagrams for describing the positional relationship between mounting lands and external connection lands of the high-frequency module 10 according to a preferred embodiment of the present invention.
Figure 4B:
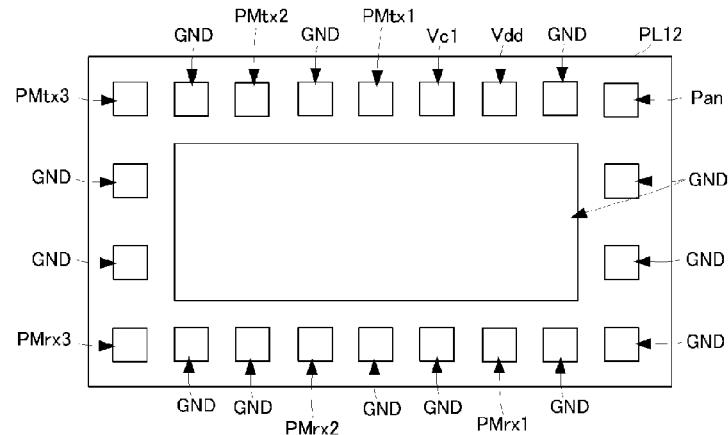
Figure 4C:
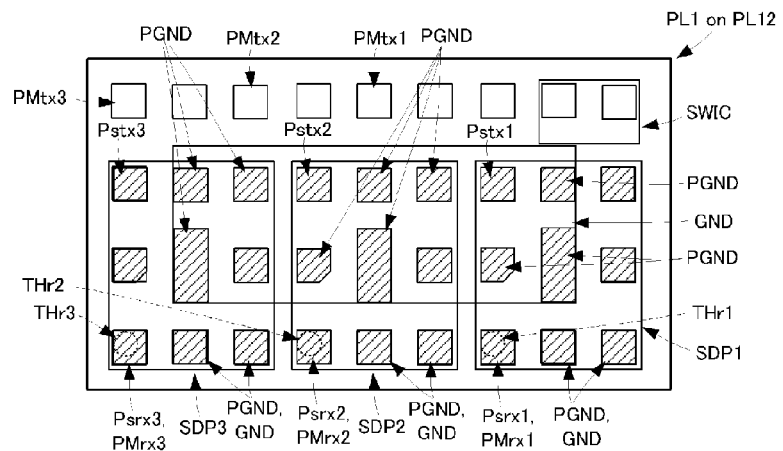

A specific structure of the high-frequency module 10 having the above circuit configuration will now be described. FIG. 3 is a layer diagram of the high-frequency module 10 according to the present preferred embodiment. FIGS. 4A-4C are diagrams for describing the positional relationship between mounting lands and the external connection lands of the high-frequency module 10 according to the present preferred embodiment. FIG. 4A is a diagram illustrating how the pattern of the mounting lands, the switch IC element SWIC, and the SAW duplexers SDP1, SDP2, and SDP3 are arranged on a front surface of a dielectric layer PL1, which is the mounting surface of the multilayer body 11. FIG. 4B is a diagram illustrating the arrangement pattern of the external connection lands on a dielectric layer PL12, which is the bottom surface of the multilayer body 11. FIG. 4C is a diagram in which the dielectric layer PL1 and the dielectric layer PL12 are superposed on one another. Circles illustrated on the respective layers in FIG. 3 and FIGS. 4A-4C denote conductive via holes for connection of the layers.

The multilayer body 11 of the high-frequency module 10 preferably includes, for example, 12 dielectric layers PL1 to PL12 that are stacked.

The mounting lands used to mount the switch IC element SWIC and the SAW duplexers SDP1, SDP2, and SDP3 are arranged in a certain pattern on the front surface of the dielectric layer PL1, which is the uppermost layer of the multilayer body 11 (the top surface of the multilayer body 11). Although multiple discrete components are mounted along with these elements in FIG. 3, the discrete components are not inherently related to the features of various preferred embodiments of the present invention, the discrete components are not illustrated in the other diagrams.

The arrangement pattern of the mounting lands on the dielectric layer PL1 will now be more specifically described.

The SAW duplexers SDP1, SDP2, and SDP3 preferably have the same or substantially the same shape and preferably have the same or substantially the same arrangement pattern of the mounting electrodes corresponding to the transmission signal input side ports, the reception signal output side ports, and the ground connection ports described above. Accordingly, the SAW duplexers SDP1, SDP2, and SDP3 preferably have the same or substantially the same arrangement pattern of the mounting lands on the multilayer body 11 on which the mounting electrodes are mounted.

The arrangement of the mounting lands in the SAW duplexer SDP1 will be described as an example of the arrangement of the mounting lands. As illustrated in FIG. 4A, the mounting land for the transmission signal input side port Pstx1, the mounting land for a ground connection port PGND, and the mounting land for the reception signal output side port Psrx1 are formed in this order along one side of the two sides along a long-side direction of a case of the SAW duplexer SDP1. The mounting land for the ground connection port PGND, the mounting land for the antenna-side port Psc1, and the mounting land for the ground connection port PGND are arranged in this order along the other side of the two sides along the long-side direction. The mounting lands for the ground connection ports PGND are located between the mounting land for the transmission signal input side port Pstx1 and the mounting land for the ground connection port PGND, between the mounting land for the ground connection port PGND and the mounting land for the antenna-side port Psc1, and between the mounting land for the reception signal output side port Psrx1 and the mounting land for the ground connection port PGND along a short-side direction.

Since the SAW duplexers SDP1, SDP2, and SDP3 are arranged so as to be aligned with each other along the short-side direction, the patterns of the mounting lands for the SAW duplexers SDP1, SDP2, and SDP3 are also aligned and arranged along the short-side direction for every SAW duplexer.

The patterns of the mounting lands are arranged so that the SAW duplexers SDP1, SDP2, and SDP3 are mounted preferably in the same or substantially the same orientation.

In addition, the patterns of the mounting lands are arranged so that the mounting lands for the reception signal output side ports Psrx1, Psrx2, and Psrx3 of the SAW duplexer SDP1, SDP2, and SDP3, respectively, are provided near one side along the long-side direction of the multilayer body 11 and the short-side direction of the SAW duplexers SDP1, SDP2, and SDP3 is parallel or substantially parallel to the long-side direction of the multilayer body 11.

The mounting lands for the switch IC element SWIC are provided in an area opposite to the side at which the mounting lands for the reception signal output side ports Psrx1, Psrx2, and Psrx3 are aligned with respect to the mounting lands for the SAW duplexers SDP1, SDP2, and SDP3. In other words, the mounting lands for the switch IC element SWIC are located near the other side along the long-side direction of the multilayer body 11, which is the side at which the mounting lands for the transmission signal input side ports Pstx1, Pstx2, and Pstx3 are aligned. The arrangement of the switch IC element SWIC at the side of the transmission signal input side ports in the above manner allows isolation between the transmission side and the reception side to be improved.

Furthermore, the mounting land for the common terminal PIC0 in the mounting lands for the switch IC element SWIC is arranged so as to be provided near a side along the short-side direction of the switch IC element SWIC, which is close to the position where the mounting land for the antenna-side port Psc1 of the SAW duplexer SDP1 is located. In other words, the mounting land for the common terminal PIC0 of the switch IC element SWIC is arranged so as to be spaced apart from the transmission signal input side ports Pstx1, Pstx2, and Pstx3 of the SAW duplexers SDP1, SDP2, and SDP3, respectively, as much as possible.

The setting of the arrangement patterns of the mounting lands and the mounting patterns of the SAW duplexers SDP1, SDP2, and SDP3 in the above manner produces a configuration in which the transmission signal input side port Pstx1, the reception signal output side port Psrx1, and the antenna-side port Psc1 of the SAW duplexer SDP1 are spaced apart from each other by certain distances; the transmission signal input side port Pstx2, the reception signal output side port Psrx2, and the antenna-side port Psc2 of the SAW duplexer SDP2 are spaced apart from each other by certain distances; the transmission signal input side port Pstx3, the reception signal output side port Psrx3, and the antenna-side port Psc3 of the SAW duplexer SDP3 are spaced apart from each other by certain distances; and the ground connection ports PGND exist between the transmission signal input side port Pstx1, the reception signal output side port Psrx1, and the antenna-side port Psc1, between the transmission signal input side port Pstx2, the reception signal output side port Psrx2, and the antenna-side port Psc2, and between the transmission signal input side port Pstx3, the reception signal output side port Psrx3, and the antenna-side port Psc3. Accordingly, it is possible to significantly reduce or prevent interference (unnecessary electromagnetic field coupling) between the ports to ensure the high isolation.

The conductive via holes penetrating through the dielectric layers PL1 to PL12 are preferably located at the positions where the mounting lands for the reception signal output side ports Psrx1, Psrx2, and Psrx3 are located.

The mounting lands for the reception signal output side ports Psrx1, Psrx2, and Psrx3 are connected to the first, second, and third reception side external connection lands PMrx1, PMrx2, and PMrx3, respectively, located on the bottom surface of the multilayer body 11 at substantially shortest distances in the layer direction with these via holes. This allows the mounting lands to be connected to the corresponding external connection lands with low loss. In addition, since these via holes are arranged at regular or substantially regular intervals in a plan view of the multilayer body 11, it is possible to ensure the isolation between the via holes. Furthermore, since the short electrodes extending in the layer direction are realized, it is possible to significantly reduce or prevent interference between first, second, and third electrode patterns Trc1, Trc2, and Trc3 and the first, second, and third transmission side electrode patterns Trt1, Trt2, and Trt3 described below, which are located on the surfaces of the dielectric layers in parallel or substantially in parallel to each other, to ensure the higher isolation from the transmission system circuit and the antenna side circuit.

Although it is preferable to use the conductive via holes penetrating through the dielectric layers PL1 to PL12 in a completely linear manner, a structure may be adopted in which upper via holes are electrically connected to lower via holes with inner layer electrode patterns corresponding to the diameters of several via holes in intermediate dielectric layers. In this case, the inner layer electrode patterns are preferably arranged so as not to be close to the transmission signal input side ports Pstx1, Pstx2, and Pstx3.

On the dielectric layer PL2, inner layer ground electrodes GNDi for the SAW duplexers SDP1, SDP2, and SDP3 are provided.

On the dielectric layer PL3, the inner layer ground electrode GNDi for the switch IC element SWIC is provided. Providing the inner layer ground electrodes GNDi for the SAW duplexers SDP1, SDP2, and SDP3 on the layer different from the layer on which the inner layer ground electrode GNDi for the switch IC element SWIC is located in the above manner allows the unnecessary electromagnetic field coupling between the inner layer ground electrodes to be prevented so as to prevent the transmission signals and the reception signals from being unnecessarily transmitted via the inner layer ground electrodes.

In addition, the first electrode pattern Trc1 that connects the switch IC element SWIC to the SAW duplexer SDP1, the second electrode pattern Trc2 that connects the switch IC element SWIC to the SAW duplexer SDP2, and the third electrode pattern Trc3 that connects the switch IC element SWIC to the SAW duplexer SDP3 are located on the dielectric layer PL3.

On the dielectric layers PL4 and PL5, the inner layer ground electrode GNDi for the switch IC element SWIC is provided, as on the dielectric layer PL3.

On the dielectric layers PL4, PL5, PL6, and PL7, the inner layer electrode patterns that realize inductors (not illustrated in the circuit diagram) of the high-frequency module 10 are provided.

On the dielectric layer PL7, the first transmission side electrode pattern Trt1 that connects the SAW duplexer SDP1 to the first transmission side external connection land PMtx1 of the high-frequency module 10, the second transmission side electrode pattern Trt2 that connects the SAW duplexer SDP2 to the second transmission side external connection land PMtx2 of the high-frequency module 10, and the third transmission side electrode pattern Trt3 that connects the SAW duplexer SDP3 to the third transmission side external connection land PMtx3 of the high-frequency module 10 are formed.

The first, second, and third transmission side electrode patterns Trt1, Trt2, and Trt3 are arranged so as to extend to the direction opposite to the side of the mounting lands for the reception signal output side ports Psrx1, Psrx2, and Psrx3 from the positions where the transmission signal input side ports Pstx1, Pstx2, and Pstx3 are mounted. This allows the isolation from the via holes composing the reception system circuit to be ensured. The first, second, and third transmission side electrode patterns Trt1, Trt2, and Trt3 are preferably arranged parallel or substantially parallel to each other substantially over the side along the short-side direction of the multilayer body 11. This allows the isolation to be improved also for the first, second, and third transmission side electrode patterns Trt1, Trt2, and Trt3.

In addition, since the first, second, and third transmission side electrode patterns Trt1, Trt2, and Trt3 are arranged so as to be spaced apart from the via holes that connect to the mounting lands for the reception signal output side ports Psrx1, Psrx2, and Psrx3 without being close to the via holes, it is also possible to ensure the isolation between the transmission side circuit and the reception side circuit.

On the dielectric layer PL8, only the via holes are provided.

On the substantially entire surface of the dielectric layer PL9, the inner layer ground electrode GNDi is provided.

On the dielectric layer PL10, the inner layer electrode patterns that realize capacitors (not illustrated in the circuit diagram) of the high-frequency module 10 and the wiring patterns for the inductors described above are provided.

On the substantially entire surface of the dielectric layer PL11, the inner layer ground electrode GNDi is provided.

The various external connection lands are provided at the bottom surface side of the dielectric layer PL12 of the bottom surface of the multilayer body 11. The external ground connection land GND is provided at a central portion in a plan view of the dielectric layer PL12.

The third reception side external connection land PMrx3, the two external ground connection lands GND, the second reception side external connection land PMrx2, the two external ground connection lands GND, the first reception side external connection land PMrx1, and the two external ground connection lands GND are provided in this order along the long-side direction near one side along the long-side direction of the dielectric layer PL12 (near the side at the side where the mounting lands for the reception signal output side ports Psrx1, Psrx2, and Psrx3 described above are arranged). The external connection lands are arranged so that the mounting land for the reception signal output side port Psrx3 is superposed on the third reception side external connection land PMrx3, the mounting land for the reception signal output side port Psrx2 is superposed on the second reception side external connection land PMrx2, and the mounting land for the reception signal output side port Psrx1 is superposed on the first reception side external connection land PMrx1, when the multilayer body 11 is viewed along the layer direction. Accordingly, it is possible to connect the mounting lands to the corresponding external connection lands at shortest distances only with the via holes penetrating through the multilayer body 11.

The third transmission side external connection land PMtx3, the external ground connection land GND, the second transmission side external connection land PMtx2, the external ground connection land GND, the first transmission side external connection land PMtx1, the external connection land for application of the control voltage Vc1, the external connection land for application of the drive voltage Vdd, the external ground connection land GND, and the antenna-side external connection land Pan are provided in this order along the long-side direction near the other side along the long-side direction of the dielectric layer PL12 (near the side opposite to the side at which the mounting lands for the reception signal output side port Psrx1, Psrx2, and Psrx3 described above are arranged).

The first transmission side external connection land PMtx1 is connected to the first transmission side electrode pattern Trt1 on the dielectric layer PL7 via the via holes. The second transmission side external connection land PMtx2 is connected to the second transmission side electrode pattern Trt2 on the dielectric layer PL7 via the via holes. The third transmission side external connection land PMtx3 is connected to the third transmission side electrode pattern Trt3 on the dielectric layer PL7 via the via holes.

Only the external ground connection lands GND are provided along the two sides along the short-side direction of the dielectric layer PL12.

The arrangement of the first, second, and third transmission side external connection lands PMtx1, PMtx2, and PMtx3 and the first, second, and third reception side external connection lands PMrx1, PMrx2, and PMrx3 along the two opposing sides of the multilayer body 11 so that the first, second, and third transmission side external connection lands PMtx1, PMtx2, and PMtx3 are spaced apart from the first, second, and third reception side external connection lands PMrx1, PMrx2, and PMrx3 in the above manner allows the isolation between the transmission system circuit and the reception system circuit to be ensured in the arrangement pattern of the external connection lands.

In addition, the arrangement of the antenna-side external connection land Pan and the first, second, and third reception side external connection lands PMrx1, PMrx2, and PMrx3 along the two opposing sides of the multilayer body 11 so that the antenna-side external connection land Pan is spaced apart from the first, second, and third reception side external connection lands PMrx1, PMrx2, and PMrx3 allows the isolation between the antenna side circuit and the reception system circuit to be ensured in the arrangement pattern of the external connection lands.

Furthermore, the provision of the external connection land for application of the control voltage Vc1, the external connection land for application of the drive voltage Vdd, and the external ground connection land GND between the first transmission side external connection land PMrx1 closest to the antenna-side external connection land Pan, among the first, second, and third transmission side external connection lands PMtx1, PMtx2, and PMtx3, and the antenna-side external connection land Pan also allows the isolation between the antenna side circuit and the transmission side circuit to be ensured.

Furthermore, since the transmission system circuit and the antenna side circuit (the electrode patterns and the via holes) are arranged so as to be spaced apart from the reception system circuit (the via holes) also in the multilayer body 11, as described above, it is possible to ensure the isolation between the antenna side circuit and the transmission system circuit, and the reception system circuit also in the structure in the multilayer body 11.

Furthermore, the inner layer ground electrodes GNDi and the external ground connection lands GND are arranged so as to be superposed on the mounting lands for the ground connection ports PGND of the SAW duplexers SDP1, SDP2, and SDP3, viewed from the layer direction, and these lands and electrodes are connected to each other along the layer direction via the via holes. In such a structure, the mounting lands for the ground connection ports PGND, the inner layer ground electrodes GNDi, the external ground connection lands GND, and the via holes via which the lands and the electrodes are connected to each other cause the electrodes connected to the ground to be arranged between the antenna side circuit and the transmission system circuit, and the reception system circuit. Accordingly, it is possible to ensure the much higher isolation between the antenna side circuit and the transmission system circuit, and the reception system circuit.

As described above, the use of the configuration of the present preferred embodiment allows the interference between the reception system circuit, and the transmission system circuit and the antenna side circuit to be significantly reduced or prevented in the entire high-frequency module 10 to realize the high-frequency module having the high isolation.

The configuration in which the mounting lands for the reception signal output side ports Psrx1, Psrx2, and Psrx3 are superposed on the first, second, and third reception side external connection lands PMrx1, PMrx2, and PMrx3, viewed from the layer direction, is exemplified in the above description. However, the mounting lands for the reception signal output side ports Psrx1, Psrx2, and Psrx3 may be partially superposed on the first, second, and third reception side external connection lands PMrx1, PMrx2, and PMrx3. Alternatively, the positional relationship in which the mounting lands for the reception signal output side ports Psrx1, Psrx2, and Psrx3 are close to the first, second, and third reception side external connection lands PMrx1, PMrx2, and PMrx3 may be established.

Figure 5A:
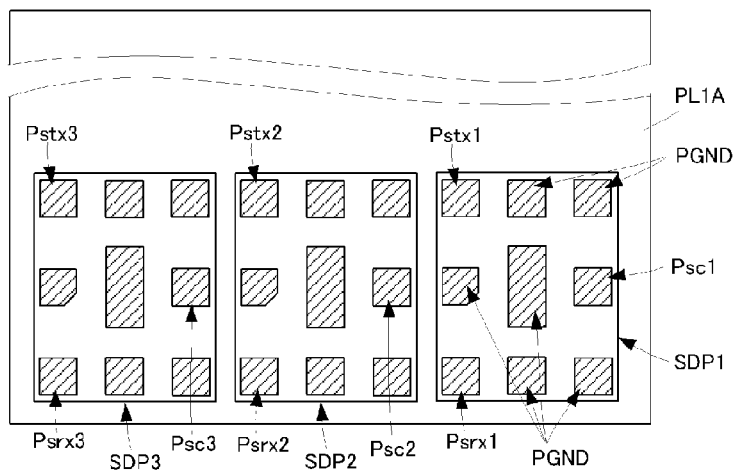
FIGS. 5A and 5B are diagrams for describing the positional relationship between the mounting lands and the external connection lands of a high-frequency module having another configuration according to a preferred embodiment of the present invention.
Figure 5B:
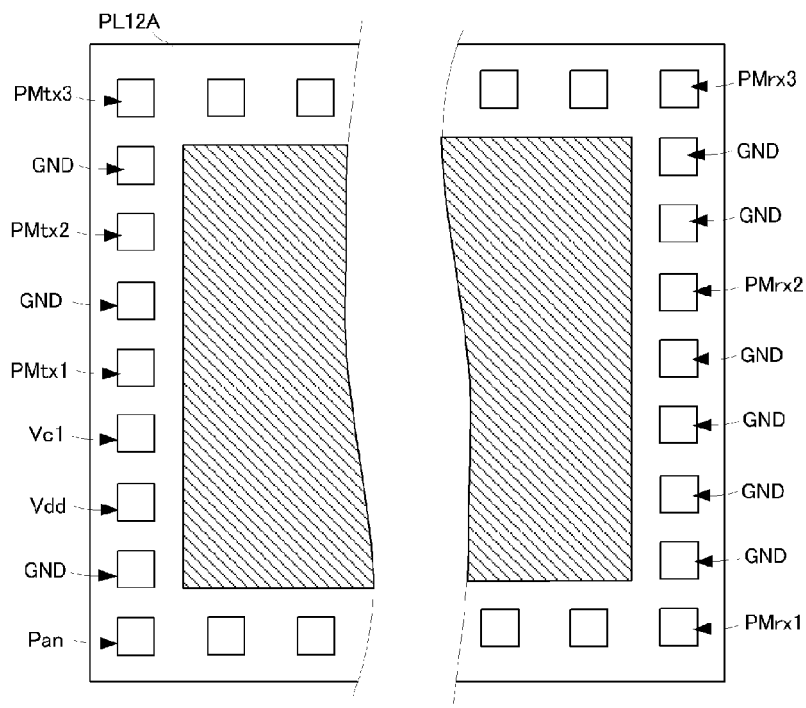

Furthermore, it is sufficient to establish the positional relationship between the mounting lands for the reception system and the external connection lands so that the wiring pattern of the reception system circuit is spaced from the transmission system circuit by at least a certain distance and the wiring pattern of the reception system circuit is not superposed on the transmission system circuit, viewed from the layer direction. Accordingly, for example, as illustrated in FIG. 5, the external connection lands for the reception system may be aligned and arranged along the direction perpendicular or substantially perpendicular to the direction in which the SAW duplexers SDP1, SDP2, and SDP3 are aligned while keeping the positions where the SAW duplexers SDP1, SDP2, and SDP3 are mounted. FIGS. 5A and 5B are diagrams for describing the positional relationship between the mounting lands and the external connection lands of a high-frequency module having another configuration according to a preferred embodiment. FIG. 5A is a diagram illustrating the pattern of the mounting lands on the front surface of a dielectric layer PL1A, which is the mounting surface of the multilayer body. FIG. 5B is a diagram illustrating the arrangement pattern of the external connection lands on a dielectric layer PL12A, which is the bottom surface of the multilayer body.

Although the high-frequency module using the three SAW duplexers is exemplified in the above description, the above configuration is also applicable to a case in which the SAW duplexers of another number are used.

Although the mounting of the SAW duplexers on the top surface of the multilayer body 11 is exemplified in the above description, a configuration in which the SAW duplexers SDP and so on are mounted on certain intermediate layers of the multilayer body 11 may be adopted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a switch integrated circuit that includes a common terminal and a plurality of individual terminals;
a surface acoustic wave duplexer that is connected to the individual terminals and that multiplexes and demultiplexes a transmission signal and a reception signal of a communication signal;
a multilayer body that includes mounting lands with which the switch integrated circuit and the surface acoustic wave duplexer are mounted on a certain surface other than a bottom surface and including external connection lands on the bottom surface and having a certain three-dimensional shape;
a transmission side external connection land with which the transmission signal is input;
an external connection land connected to an antenna;
a reception side external connection land with which the reception signal is output are provided along opposing sides, in a plan view of the multilayer body, and the transmission side external connection land and the external connection land connected to the antenna are spaced apart from the reception side external connection land; and
a reception side mounting land where a reception signal side port of the surface acoustic wave duplexer is mounted is connected to the reception side external connection land by via holes.

2. The high-frequency module according to claim 1, wherein the reception side external connection land and the external connection land connected to the antenna are provided along the opposing sides, in a plan view of the multilayer body, so that the reception side external connection land is spaced apart from the external connection land connected to the antenna.

3. The high-frequency module according to claim 1, wherein the switch integrated circuit is arranged along one side of the multilayer body along which the transmission side external connection land is arranged and the surface acoustic wave duplexer is arranged along the other side of the multilayer body along which the reception side external connection land is arranged.

4. The high-frequency module according to claim 1, wherein the reception side mounting land is provided at a position where the reception side mounting land is superposed on the reception side external connection land, in a plan view of the multilayer body.

5. The high-frequency module according to claim 1, further comprising ground electrodes located between the reception side external connection land and the transmission side external connection land and between the reception side mounting land and a transmission side mounting land where a transmission signal side port of the surface acoustic wave duplexer is mounted, in a plan view of the multilayer body, at least one of on a mounting surface of the multilayer body and in the multilayer body; wherein
the ground electrodes are connected to a ground mounting land where a ground port of the mounted surface acoustic wave duplexer is mounted by via holes.

6. The high-frequency module according to claim 1, wherein
an external ground connection electrode is located between the reception side external connection land and the transmission side external connection land on the bottom surface of the multilayer body, in a plan view of the multilayer body; and
the external ground connection electrode is superposed on the ground mounting land, in a plan view of the multilayer body.

7. The high-frequency module according to claim 1, wherein
the switch integrated circuit includes a plurality of individual terminals and different surface acoustic wave duplexers are connected to the plurality of individual terminals; and
an alignment axis of the reception side mounting land and an alignment axis of the transmission side mounting land, along which each surface acoustic wave duplexer is mounted, are parallel or substantially parallel to each other at certain interval.

8. The high-frequency module according to claim 7, wherein an antenna side port of each of the plurality of surface acoustic wave duplexers is arranged along a side opposite to the side where the reception signal side port and the transmission signal side port of the surface acoustic wave duplexer are provided; and
the plurality of surface acoustic wave duplexers are mounted so that the reception signal side port and the transmission signal side port are sandwiched between the antenna side ports of the plurality of surface acoustic wave duplexers along the alignment axes of the reception side mounting land and the transmission side mounting land.

9. The high-frequency module according to claim 1, wherein
the transmission side external connection land and the external connection land connected to the antenna are aligned and arranged along one side of the multilayer body; and
the external connection land for application of a signal to drive the switch integrated circuit is provided between the transmission side external connection land and the external connection land connected to the antenna.

10. The high-frequency module according to claim 1, wherein
the multilayer body includes a plurality of dielectric layers that are stacked;
a first inner layer ground electrode for the switch integrated circuit and a second inner layer ground electrode for the surface acoustic wave duplexer are provided in the multilayer body; and
the first inner layer ground electrode and the second inner layer ground electrode are located on different dielectric layers in the multilayer body.

11. The high-frequency module according to claim 1, wherein the surface acoustic wave duplexer includes a transmission signal input side port, a reception signal output side port, and an antenna-side port which are spaced apart from each other by certain distances.

12. The high-frequency module according to claim 11, further comprising a ground connection port located between the transmission signal input side port, the reception signal output side port, and the antenna-side port.

13. The high-frequency module according to claim 1, further comprising at least two additional surface acoustic wave duplexers, wherein each of the surface acoustic wave duplexers have the same or substantially the same shape and the same or substantially the same arrangement pattern of the mounting lands.

14. The high-frequency module according to claim 13, wherein a second of the surface acoustic wave duplexers includes a transmission signal input side port, a reception signal output side port, and an antenna-side port which are spaced apart from each other by certain distances.

15. The high-frequency module according to claim 14, wherein a third of the surface acoustic wave duplexers includes another transmission signal input side port, another reception signal output side port, and another antenna-side port which are spaced apart from each other by certain distances.

16. The high-frequency module according to claim 14, further comprising a ground connection port located between the transmission signal input side port, the reception signal output side port, and the antenna-side port.

17. The high-frequency module according to claim 15, further comprising a ground connection port located between the another transmission signal input side port, the another reception signal output side port, and the another antenna-side port.

18. The high-frequency module according to claim 13, wherein each of the surface acoustic wave duplexers includes transmission side external connection lands and reception side external connection lands which are arranged along the two opposing sides of the multilayer body the respective transmission side external connection lands are spaced apart from the corresponding reception side external connection lands.

19. The high-frequency module according to claim 18, wherein the external connection lands include an antenna-side external connection land, and the antenna-side external connection land and the reception side external connection lands are arranged along the two opposing sides of the multilayer body so that the antenna-side external connection land is spaced apart from the reception side external connection lands.

20. The high-frequency module according to claim 13, wherein the surface acoustic wave duplexers are mounted on a top surface of the multilayer body or mounted on intermediate layers of the multilayer body.

* * * * *